United States Patent [19]

Shih

[11] 3,988,691
[45] Oct. 26, 1976

[54] POWER AMPLIFIER

[75] Inventor: Kelvin Shih, Detroit, Mich.

[73] Assignee: Kelvin Shih, Troy, Ohio

[22] Filed: Apr. 16, 1975

[21] Appl. No.: 568,731

[52] U.S. Cl. ................................. 330/15; 330/13; 330/17; 330/22; 330/28
[51] Int. Cl.² .......................................... H03F 3/26
[58] Field of Search .................. 330/13, 15, 17, 28, 330/22, 38 M, 30 D

[56] References Cited
UNITED STATES PATENTS

| 3,553,599 | 1/1971 | Hayamizy | 330/29 |
| 3,631,357 | 12/1971 | Hadley | 330/17 |

OTHER PUBLICATIONS

Wade, "IC Driver For Power Amplifier," *Wireless World*, Nov. 1969, p. 530.

Primary Examiner—James B. Mullins
Attorney, Agent, or Firm—Cullen, Settle, Sloman & Cantor

[57] ABSTRACT

A power amplifier circuit including a low power output general purpose operational amplifier. The circuit provides an output voltage swing far greater in magnitude than the output voltage swing of the operational amplifier and with a faster response than the slew rate of the operational amplifier. The circuit, which is complementary, includes voltage dividers which couple the output of the operational amplifier to constant current mode driver transistors. Power transistors amplify the output of the constant current mode transistors to provide a high power low distortion output.

3 Claims, 3 Drawing Figures

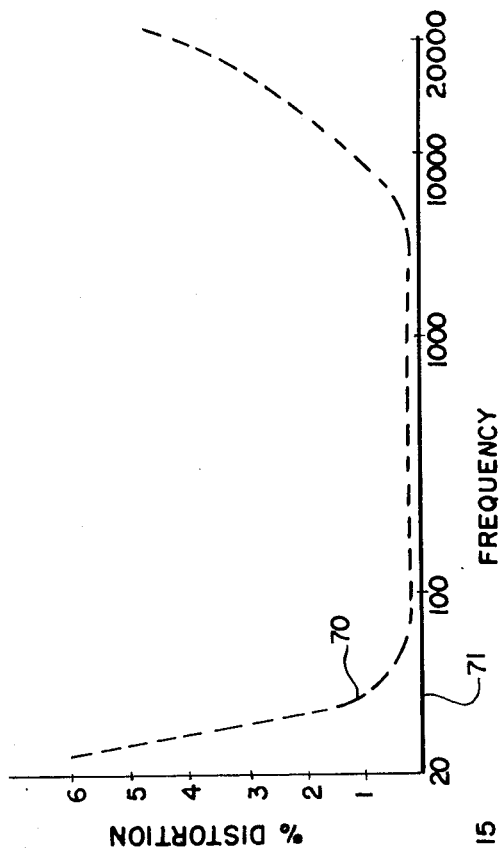
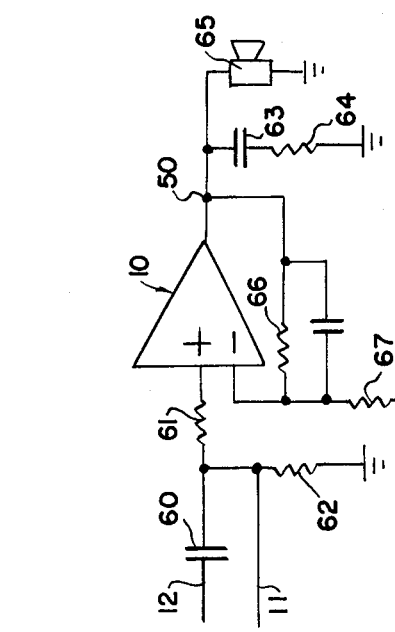
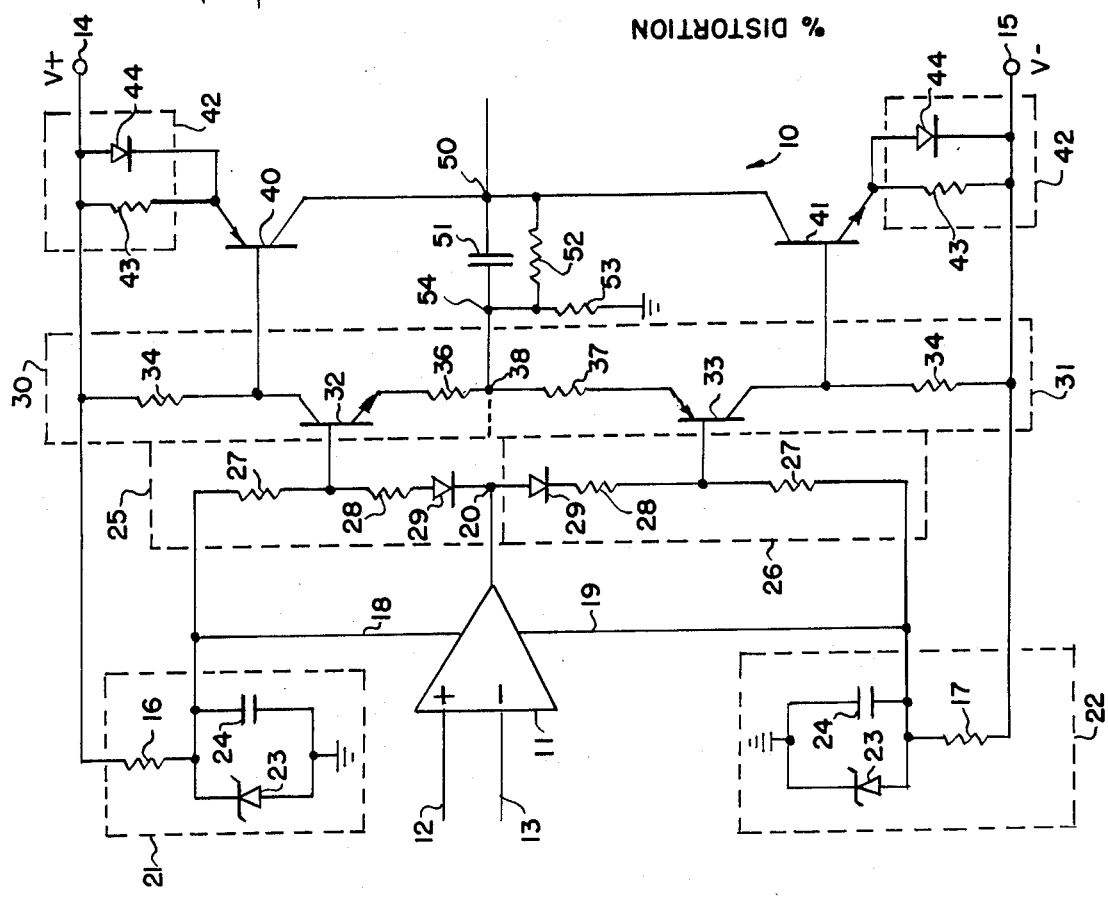
FIG. 2
FIG. 3
FIG. 1

POWER AMPLIFIER

BACKGROUND OF THE INVENTION

This invention relates in general to power amplifiers and, more particularly, to a very low distortion power amplifier or servo-amplifier which includes an operational amplifier but which is not limited by the inherent limitations of the operational amplifier.

One preferred mode of operation of the power amplifier of the present invention is in a stereo system and, hence, the problems of the prior art and the benefits of the present invention will be described in that context. It is to be understood, however, that there are many other usages for the present invention as will be explained in greater detail.

In a stereo system, the function of a power amplifier is twofold. First, the power amplifier serves as an impedance match between the output from the pre-amplifier, which is typically 10 k ohms and the speaker which is typically 8 ohms. Secondly, the power amplifier takes the output signal from the pre-amplifier, which pre-amplifier provides both frequency response and some limited voltage amplification, and the power amplifier amplifies the voltage by approximately 15 times and the current by approximately 1,000 times to provide power amplification of 15,000 times the output of the pre-amplifier.

General purpose operational amplifiers are very well known. It is also known that they have certain inherent limitations. For example, they have a limited frequency response and a very limited slew rate. Yet another problem is that the output voltage swing cannot exceed the supply voltage. Since the supply voltage is typically in the range of 15 volts, this results in a very limited power output rating for the operational amplifier.

Based upon all these inherent limitations of a general purpose operational amplifier, they cannot be used in a power amplifier except for a most limited output power rating and with frequency distortion of the output signal.

Thus, the present invention provides an improved power amplifier utilizing a general purpose operational amplifier without the aforementioned limitations.

SUMMARY OF THE INVENTION

The present invention includes a general purpose operational amplifier and a complementary circuit which includes voltage dividers coupling the output of the operational amplifier to a pair of transistors which operate in the constant current mode. The output of the operational amplifier induces a change in current through the constant current mode transistors. Power transistors amplify the changing output of the constant current mode transistors to provide a high power low distortion output.

The circuit also includes a biased network for the power transistors to prevent breakdown of the junction of the power transistors. A negative feedback loop is provided to prevent circuit oscillations.

The operation of the circuits may be analogized to modulation of a carrier. The carrier is provided through the constant current mode transistors. The modulation signal is provided by the output of the operational amplifier. The modulations are amplified by a power amplifier.

Although the circuit is explained in the context of a stereo amplifier, it must be appreciated that the power amplification technique can be utilized in many applications requiring a high-power output, utilizing a low cost operational amplifier. Furthermore, this circuit can be utilized as part of a servo or a feedback control system.

BRIEF DESCRIPTION OF THE DRAWINGS

The foregoing advantages of the present invention, together with other objects and advantages which may be attained by its use, will become apparent upon consideration of the following detailed description taken in conjunction with the drawings.

In the drawings, wherein like reference numerals identify corresponding components:

FIG. 1 is a detailed schematic drawing of the circuit of the present invention;

FIG. 2 is a circuit showing the use of the power operational amplifier between the pre-amplifier and the speaker of a stereo system; and FIG. 3 is a graph showing the distortion from the power amplifier of the present invention compared to a typical power amplifier distortion.

DETAILED DESCRIPTION OF THE INVENTION

With reference first to FIG. 1, the circuit 10 of the present invention is illustrated including an operational amplifier 11 having an inverted signal input at 12 and a non-inverted signal input at 13. Line voltage to the circuit 10 is provided at the positive and negative terminals 14 and 15, respectively.

When the circuit of the present invention is utilized as a power amplifier for a stereo system, the line voltage at terminals 14 and 15 is based upon the desired power output. For example, when the desired output of the stereo system is 100 watts per channel, then 45 volts must be applied at terminals 14 and 15. When 200 watts per channel are desired, then 70 volts must be applied at terminals 14 and 15.

The unregulated positive and negative supply voltage is applied across resistors 16 and 17 to the two complementary inputs 18 and 19 of the operational amplifier 11. Since the general purpose operational amplifier, such as a type 741, utilized 15 volt supply, resistors 16 and 17 are chosen based upon the line voltage at terminals 14 and 15. when 45 volts line voltage is applied, then resistors 16 and 17 are each 300 ohms. This provides the 15 volt supply voltage on leads 18 and 19 to the operational amplifier. The output from the operational amplifier appears at terminal or junction 20.

In order to provide stable operation of the circuit, two voltage regulators 21 and 22 are provided. These voltage regulators provide the supply voltage to the operational amplifier at 15 volts and also provide a regulated voltage to the bias network, as will be explained hereinafter. Each voltage regulator includes its respective resistor 16 or 17 connected in series with the parallel circuit of a 1 N 4744 zener diode 23 and a 1 microfarad capacitor 24. The opposite side of this parallel portion of the voltage regulator is grounded.

The regulated 15 volts is also fed to a pair of voltage dividers 25, 26, each of which includes a series connection of resistors 27 and 28 and a diode 29. The two voltage dividers 25 and 26 meet at terminal 20, the output from the operational amplifier 11.

The circuit 10 includes driver circuits 30, 31, each including a transistor 32, 33. Transistor 32 has its base coupled to the junction of resistors 27 and 28 of the voltage divider 25 and has its collector coupled through a 220 ohm resistor 34 to the line voltage 14. Similarly, transistor 33 has its base coupled to the junction of resistors 27 and 28 of voltage divider 26 and has its collector coupled through a resistor 34 of 220 ohms to the line voltage 15. Each transistor 32, 33 has its emitter coupled through a resistor 36, 37 to a common junction 38.

The circuit includes a pair of Darlingtion power transistors 40, 41 which may either be integrated Darlington transistors or composite transistors, having a multiple gain stage as is conventional. While the normal gain of a single stage or a single transistor is 10–15, the total gain of the Darlington or the composite transistors is 750–1,000.

The emitter of each Darlington transistor is connected through a low power bias network 42 to the line voltage. The low power bias network 42 includes a 10 ohm resistor 43 and a diode 44 which can be either a high-speed rectifier or a transistor having its collector and base connected together. The purpose of the diode 44 is to provide high-speed rectification.

Explaining the function of the low power bias network in greater detail, it is known that to avoid cross-over distortion, the Darlington transistors must be operated in the constant conduction mode, i.e., there can be no junction breakdown. Furthermore, it is known that the "on" voltage of a Darlington is approximately 1.3 volts. The drop-across resistors 34 is normally 1.6 volts. Diode 44 is a 0.7 volt silicon diode and the drop-across each junction of the Darlington is 0.7 volts. Thus, the voltage drop-across the three junctions is 2.1 volts. Then the bias condition is the difference between the normal voltage drop-across resistor 34 of 1.6 volts minus the two-junction Darlington voltage drop of 1.4 volts divided by the 10 ohm-resistance of resistor 43 or 20 milliamps. Thus, the Darlington operates as a constant current source having a 20 milliamp bias. This provides class A-B amplifier operation.

When the Darlington 40 heats up, the forward bias of the junctions drop from 1.4 to approximately 1.2, which could cause thermal runaway and burn out of the circuit. To prevent this, positive feedback is provided by mounting the diodes 29 on the same heat sink as the Darlington transistors 40. This is a common technique and is well known.

Since the drop-across resistor 34 is 1.6 volts, the 10-ohm resistor 43 of the bias network 42 provides constant current source operation of the Darlington. During operation of the circuit, as will be explained later, the increase in the voltage drop-across resistor 34 up to 2.1 volts (the equivalent of a three-junction voltage drop) still does not result in full conduction because of resistor 43 and the constant current source mode of operation. When the voltage drop-across resistor 34 exceeds 2.1 volts, then the voltage differential again prevents breakdown of the Darlington. Hence, the Darlington transistors 40 cannot break down.

The collectors of the two Darlington transistors 40, 41 are connected together at an output terminal 50. This provides the output to the speaker.

A feedback network is also provided between junction 38 and junction 50. Specifically, a capacitor 51 of 3300 picofarads is coupled directly between junction 38 and junction 50. Coupled across capacitor 51 is a voltage divider network of resistors 52 and 53 of 3.3 ohms and 47 ohms, respectively, coupled together and to the capacitor 51 at terminal 54. This feedback network operates so that the voltage divider of resistors 52 and 53 provide feedback for both the driver circuits 30, 31 and the output stages of the Darlington's 40 and 41, and the capacitor 51 and resistor 53 determine the frequency response of the Darlington transistors 40, 41.

The operation of the circuit will now be explained.

OPERATION

When the output of the operational amplifier, taken at terminal 20, is positive, transistor 32 goes on and transistor 33 goes off. The drop-across resistor 34 increases based upon the magnitude of the output voltage at terminal 20. The constant current mode Darlington 40 goes on, while Darlington 41 goes off, and the power transistor or Darlington 40 amplifies the signal based upon the increase in current through driver transistor 32. This drives terminal 50 positive.

At this time, a fuller explanation of the negative feedback circuit should be explained. The junction 38 between the two driver circuits 30 and 31 is, of course, floating. As the voltage at the upper terminal 50 increases, the voltage at terminal or junction 54 increases by a smaller amount, based upon the ratio of the feedback voltage dividers, R53/(R53 + R52). This increase at junction or terminal 54 raises the voltage at junction 38. This increases the emitter voltage for transistor 32, thus, providing negative feedback by decreasing the current through transistor 32. Similarly, capacitor 51 provides better frequency response and bias stabilization and eliminates oscillations of the circuit.

Since this is a complementary circuit, if the voltage at junction 20 decreases then, of course, transistor 32 is off and transistor 33 is on and Darlington 41 is on and Darlington 40 is off. Then the feedback is "negative" with respect to a negative signal at terminal 50.

FIG. 2 illustrates the use of the circuit of FIG. 1 in one channel of a stereo system, it being understood that, of course, there are multiple channels depending upon whether a stereophonic or quadrophonic system is utilized. In FIG. 2, the circuit 10 of FIG. 1 is shown as an operational amplifier as is customary when you have power amplification, using the operational amplifier as in FIG. 1. An optional bypass capacitor 60 of 10 microfarads is shown and depends upon the particular pre-amplifier utilized. Of course, it may be desirable to have D.C. response if the circuit is being utilized as a servo amplifier.

To prevent oscillation, also, as is common, a small 100 ohm resistor 61 is provided in series with the input signal on line 12 and a 10 k ohm resistor 62 provides a ground return for the non-inverted input. The output of the circuit 10 of FIG. 1, as shown in FIG. 2 at terminal 50, is coupled through a 0.1 microfarad capacitor 63 and a 10 ohm resistor 64 which are connected in series between terminal 50 and ground to prevent output oscillations as the output signal is coupled to the speaker 65, as is well known. Gain or feedback gain control is provided by the combination of a 1.5 k ohm resistor 66 in the feedback that work between the output 50 and the negative input to the circuit 10 with a 100 ohm biasing resistor 67.

FIG. 3 is a graph showing the distortion of a power operational amplifier built in accordance with the principles of the present invention as compared to a typical power operational amplifier. Specifically, with reference to FIG. 3, the dotted curve 70 shows the typical harmonic distortion which is above 6 percent at 20 hertz and drops to approximately 0.03 percent to 0.05 percent from around 60 to around 4,000 hertz and then increases as frequency increases. Shown at the solid line 71 is the distortion actually measured with the present circuit. Specifically, based upon tests at an independent laboratory, absolute flat response, i.e., no distortion, was the result of testing between a frequency of 20 and 20,000 hertz.

The importance of this distortion may be better appreciated with reference to the Nov. 4, 1974 Federal Trade Commission report entitled "Power Output Claims for Amplifiers Used in Home Entertainment Products." Specifically, in advertising distortion and power, the Federal Trade Commission requires that the circuit be operated for one hour at one-third of the full rating and then for five minutes at the full rating before testing and evaluation. The results shown in FIG. 3 were based upon compliance with such requirements. The results were obtained testing a stereo amplifier at 50 watts per channel. The importance of this may be further emphasized by the fact that many power amplifiers for stereo systems will totally burn out if operated at full power rating for five minutes. Hence, this requirement in the Federal Trade Commission regulations is of significant importance.

It must be appreciated that the operational amplifier circuit 10 of the present invention may be utilized in various environments other than in a stereophonic home entertainment system. Thus, the invention should be limited only by the scope of the following claims.

What is claimed is:

1. In an amplifier circuit including a conventional operational amplifier and a pair of conventional voltage regulators for providing positive and negative supply voltage to the operational amplifier, the improvement of a complementary circuit for providing low distortion high power class A-B amplification comprising:
 a pair of voltage dividers, each voltage divider coupled between the output of one voltage regulator and the output of the operational amplifier;
 a pair of divider circuits, each responsive to one of said voltage divider networks, each driver circuit operating in the constant current mode and having current flow responsive to changes in the output of the operational amplifier; said pair of driver circuits being connected together at a first terminal;
 a pair of power transistors, each coupled to one of said driver circuits; each power transistor operating to prevent junction breakdown and for amplifying the output of its driver circuit;
 said pair of power transistors having their collectors tied together at a second terminal and providing the circuit output at said second terminal; and
 a feedback circuit coupled between said first terminal and said second terminal to prevent oscillation of the circuit output and to provide negative feedback to said driver circuits, thereby providing faster response to the output of said operational amplifier.

2. The invention as defined in claim 1, wherein each of said power transistors circuits includes a bias network to maintain the power transistor in conduction.

3. The invention as defined in claim 1, wherein said driver circuit includes a driver transistor operated as a constant current source and having its collector connected to the base of the transistor in said power transistor circuit.

* * * * *